(12) United States Patent
Huang et al.

(10) Patent No.: US 11,233,627 B2
(45) Date of Patent: *Jan. 25, 2022

(54) SYSTEM AND METHOD FOR PROVIDING FAST-SETTLING QUADRATURE DETECTION AND CORRECTION

(71) Applicant: Samsung Electronics Co., Ltd., Suwon-si (KR)

(72) Inventors: Zhiqiang Huang, San Jose, CA (US); Hiep Pham, San Jose, CA (US); Chih-Wei Yao, Sunnyvale, CA (US)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/070,577

(22) Filed: Oct. 14, 2020

(65) Prior Publication Data

US 2021/0028919 A1  Jan. 28, 2021

Related U.S. Application Data

(63) Continuation of application No. 16/274,114, filed on Feb. 12, 2019, now Pat. No. 10,841,072.

(60) Provisional application No. 62/775,565, filed on Dec. 5, 2018.

(51) Int. Cl.
*H04L 7/00* (2006.01)
*H04L 7/04* (2006.01)

(52) U.S. Cl.
CPC .......... *H04L 7/0025* (2013.01); *H04L 7/042* (2013.01); *H04L 7/048* (2013.01)

(58) Field of Classification Search
CPC .................................................. H04L 7/0025
USPC ........................................................ 375/243
See application file for complete search history.

(56) References Cited

U.S. PATENT DOCUMENTS

| | | | |
|---|---|---|---|
| 7,872,924 B2 | 1/2011 | Ma | |
| 8,004,336 B2 | 8/2011 | Yoon et al. | |
| 8,970,273 B2 | 3/2015 | Pan | |
| 10,841,072 B2 * | 11/2020 | Huang | H03M 9/00 |
| 2010/0219883 A1 * | 9/2010 | Jones | H03H 11/0422 327/553 |
| 2012/0235720 A1 | 9/2012 | Jiang et al. | |
| 2013/0207708 A1 * | 8/2013 | Agrawal | H03K 5/135 327/237 |
| 2017/0222796 A1 * | 8/2017 | Chen | H04L 7/0037 |

* cited by examiner

*Primary Examiner* — Lihong Yu
(74) *Attorney, Agent, or Firm* — Innovation Counsel LLP

(57) ABSTRACT

An apparatus for providing fast-settling quadrature detection and correction includes: a quadrature correction circuit that receives four quadrature clock signals; a quadrature detector that selects two clock signals among the four quadrature clock signals; and a phase digitizer that generates a digital code indicating a phase difference between the two clock signals. The quadrature correction circuit adjusts a phase between the two clock signals using the digital code.

18 Claims, 10 Drawing Sheets

SYSTEM AND METHOD FOR PROVIDING FAST-SETTLING QUADRATURE DETECTION AND CORRECTION

CROSS-REFERENCE TO RELATED APPLICATION(S)

This application is a continuation application of U.S. patent application Ser. No. 16/274,114 filed Feb. 12, 2019, which claims the benefits of and priority to U.S. Provisional Patent Application Ser. No. 62/775,565 filed Dec. 5, 2018, the disclosures of which are incorporated herein by reference in their entirety.

TECHNICAL FIELD

The present disclosure relates generally to a data communication system, more particularly, to a system and method for providing a fast-settling quadrature detection and correction.

BACKGROUND

Typical serializer/deserializer (SerDes) solutions for high-speed data communication are designed to have slow power-up and power-down times. For mobile chip-set applications, this requires a transmitter or a receiver remain powered up even if it is not transmitting or receiving useful data. As a result, the power efficiency of the transmitter and the receiver may be compromised, particularly when the transceiver and the receiver are running in a low bit-rate mode.

To maintain the power efficiency, a SerDes circuit that can be reconfigured into a low-power mode with a low bit-rate is highly desired when the transceiver and the receiver are running in a low bit-rate mode. However, this may make the SerDes circuit more difficult to use, and moreover, an operating speed of the SerDes circuit needs to be reconfigured every time the bit-rate changes.

SUMMARY

According to one embodiment, an apparatus includes: a quadrature correction circuit that receives four quadrature clock signals; a quadrature detector that selects two clock signals among the four quadrature clock signals; and a phase digitizer that generates a digital code indicating a phase difference between the two clock signals. The quadrature correction circuit adjusts a phase between the two clock signals using the digital code.

According to another embodiment, a method includes: receiving four quadrature clock signals including a first quadrature clock signal, a second quadrature clock signal, a third quadrature clock signal, and a fourth quadrature clock signal; selecting two clock signals among the four quadrature clock signals; generating a digital code that indicates a phase difference between the two clock signals; detecting an amount of a quadrature error based on the digital code; and adjusting a phase between the two clock signals based on the digital code.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
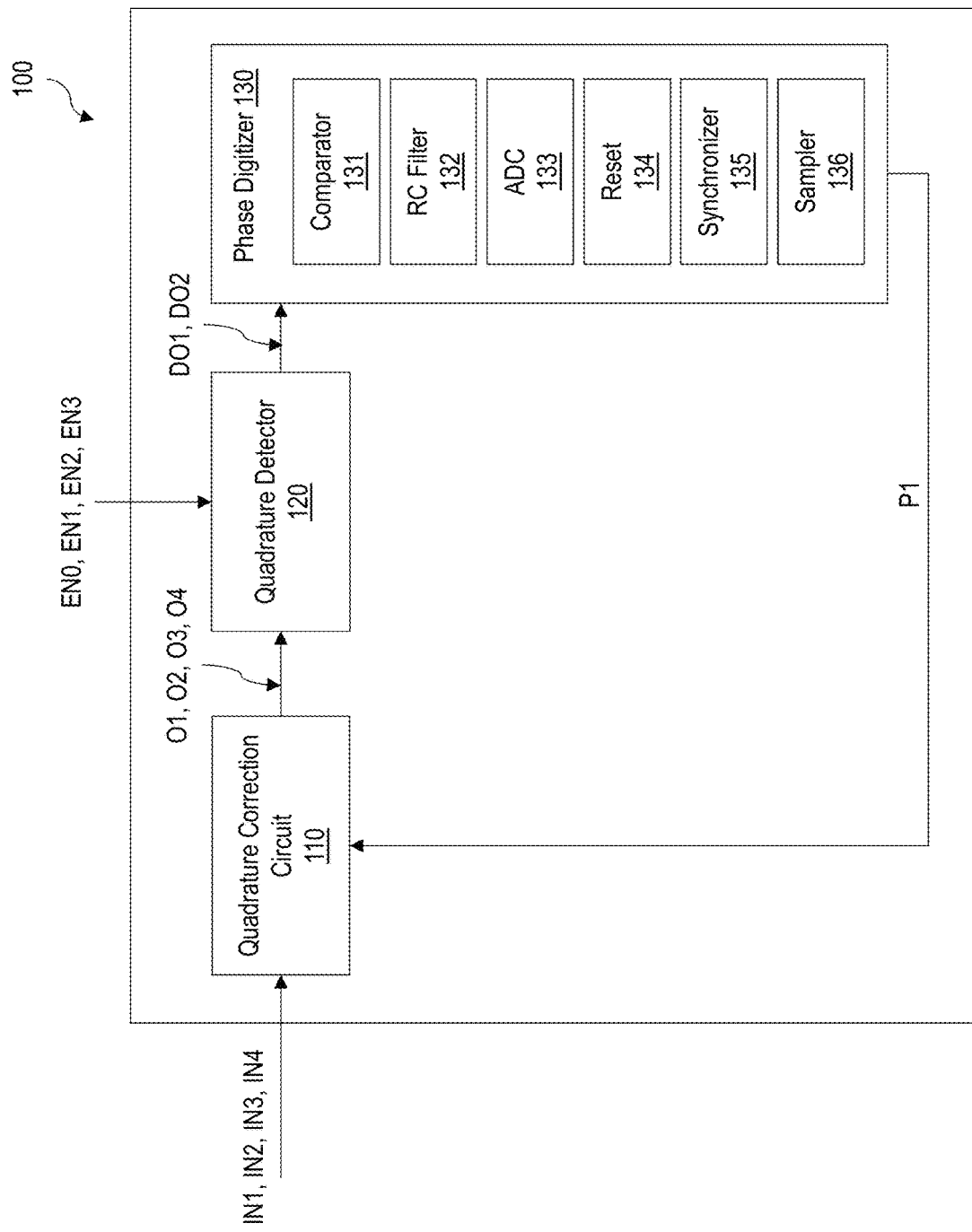
FIG. 1 is a block diagram of an example apparatus for detecting and correcting a quadrature error, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a system and method for providing a fast-settling quadrature detection and correction in any circuit and system that need accurate quadrature clock signals, such as a serializer/deserializer (SerDes) circuit and a wireless transceiver with quadrature modulation. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure provides a quadrature correction circuit for a serializer/deserializer (SerDes) used in a high-speed data communication system. In particular, the present quadrature detection and correction circuit can have a fast-settling time in detecting and correcting a quadrature error, thereby allowing the SerDes to be powered up and down quickly to save power consumption. By reducing the power-on time of SerDes, it can improve the power efficiency of the SerDes at a low-bit rate mode.

FIG. 1 is a block diagram of an example apparatus for detecting and correcting a quadrature error, according to one embodiment. An apparatus 100 includes a quadrature correction circuit 110, a quadrature detector 120, and a phase digitizer 130. The apparatus 100 may be implemented in a transmitter or a receiver in a data communication system for high-speed chip-to-chip communication.

Figure 2:
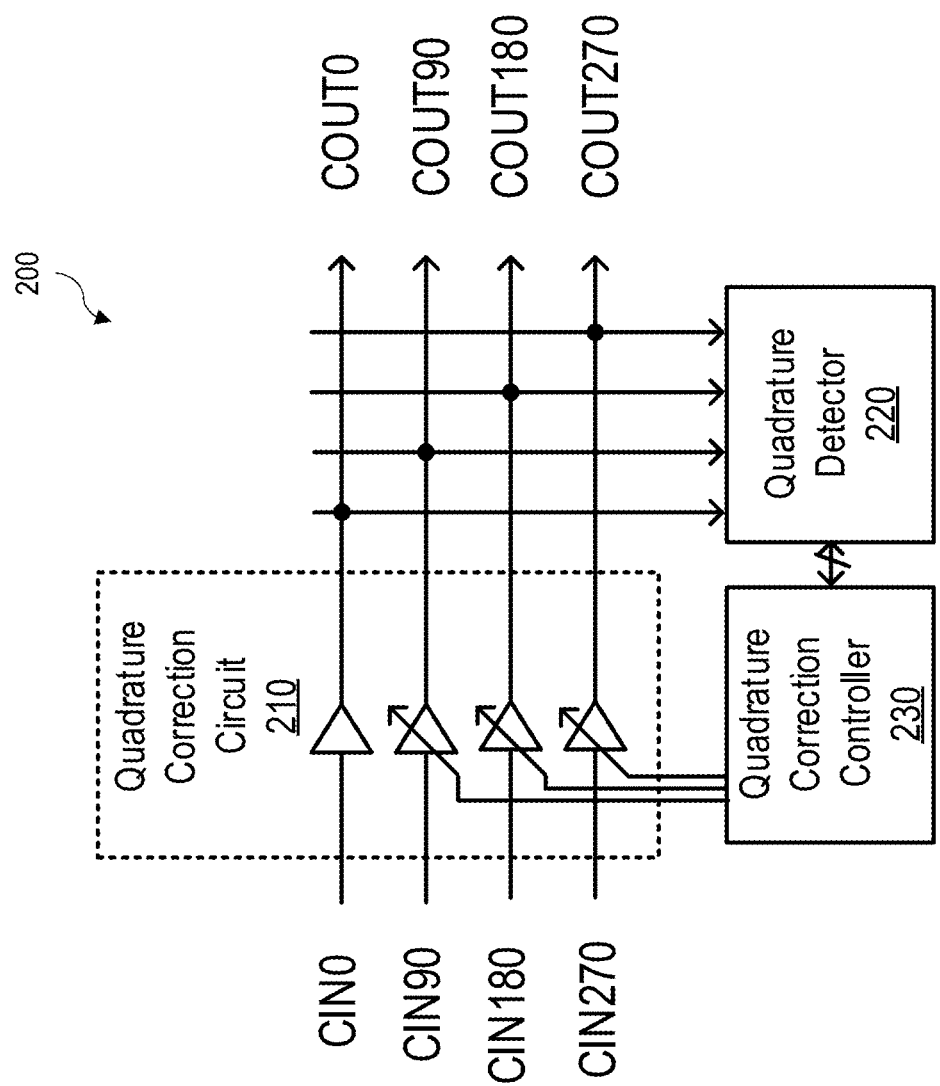
FIG. 2 shows a block diagram of an example quadrature detection and correction circuit, according to one embodiment.

The quadrature correction circuit 110 receives four quadrature input clock signals IN1, IN2, IN3, and IN4 (e.g., output clock signals COUT0, COUT90, COUT180, and COUT270 shown in FIG. 2). The four quadrature input clock signals IN1, IN2, IN3, and IN4 may have an imperfect phase quadrature between one or more adjacent ones of the four quadrature input clock signals IN1, IN2, IN3, and IN4. The adjacency of the four quadrature input clock signals IN1, IN2, IN3, and IN4 is dictated by relative phase differences thereof. The quadrature correction circuit 110 can correct the imperfect phase quadrature by adjusting one or more phases of the four quadrature input clock signals IN1, IN2, IN3, and IN4. In one embodiment, the quadrature correction circuit 110 uses the first quadrature input clock signal IN1 as a reference clock signal and generates three adjusted clock signals A2, A3 and A4 with reference to the first quadrature input clock signal IN1. The adjusted clock signal A2 is in quadrature with the adjusted clock signal A3, the adjusted clock signal A3 is in quadrature with the adjusted clock signal A4, and the adjusted clock signal A4 is in quadrature with the first quadrature input clock signal IN1. The quadrature correction circuit 110 outputs the first quadrature input clock signal IN1 and the adjusted signals A2, A3 and A4 to the quadrature detector 120 as output signals O1, O2, O3, and O4.

The quadrature detector 120 receives the output signals O1, O2, O3 and O4 from the quadrature correction circuit 110 and outputs two output signals DO1 and DO2. The two output signals DO1 and DO2 may correspond to a pair of adjacent ones of the four quadrature input clock signals (e.g., (IN1, IN2), (IN2, IN3), (IN3, IN4), and (IN4, IN1)) depending on an enable signal (e.g., EN0, EN1, EN2, and EN3).

The phase digitizer 130 receives the two (analog) signals DO1 and DO2 and outputs a digital signal P1 to the quadrature correction circuit 110. The digital signal P1 indicates a phase or timing difference amount between the two signals DO1 and DO2.

According to one embodiment, the apparatus 100 can adjust the phases of the signals A2, A3 and A4 with reference to the first quadrature input clock signal IN1 in four steps: 1) adjusting the clock signal A4 such that a phase difference between the quadrature input clock signal IN1 and the adjusted clock signal A4 matches the phase difference between the quadrature input clock signal IN1 and the clock signal A2, 2) adjusting the clock signal A3 such that a phase difference between the adjusted clock signal A3 and the adjusted clock signal A4 matches the phase difference between the adjusted clock signal A3 and the clock signal A2, 3) adjusting the clock signal A4 such that a phase difference between the quadrature input clock signal IN1 and the adjusted clock signal A4 matches the phase difference between the adjusted clock signal A3 and the adjusted clock signal A4, and 4) adjusting the clock signal A2 such that a phase difference between the quadrature input clock signal IN1 and the adjusted clock signal A2 matches the phase difference between the adjusted clock signal A2 and the adjusted clock signal A3.

According to one embodiment, the phase digitizer 130 may include a comparator 131, an RC filter 132, an analog-to-digital (ADC) circuit 133, a reset circuit 134, a synchronizer 135, and a sampling circuit 136. The comparator 131 receives the signals DO1 and DO2 as input signals and outputs a pulse signal (also referred to as a pulse train signal) that goes high at the rising edges of the first signal DO1 and goes low at the falling edge of the second signal DO2. The RC filter 132 is coupled to the output of the comparator 131 and provides a filtered pulse signal to the sampling circuit 136. The sampling circuit 136 quickly captures a voltage value of the filtered pulse signal representing a phase difference between the two signals DO1 and DO2 based on a sampling switch signal SW. The reset circuit 134 may generate the reset signal RST to reset the sampling circuit 136. The synchronizer 135 generates the sampling switch signal SW to sample the filtered pulse signal out of the RC filter 132 at a time instant synchronized to a rising edge of the second signal DO2. The ADC circuit 133 converts the voltage value received from the sampling circuit 136 to a digital code. The digital code indicates a phase difference between the two signals DO1 and DO2. The quadrature correction circuit 110 receives the digital code and adjusts the phase between adjacent ones of the four quadrature input clock signals IN1, IN2, IN3, and IN4. This process repeats until the phase or timing differences between adjacent ones of the four quadrature input clock signals IN1, IN2, IN3, and IN4 are corrected within a tolerable margin.

According to one embodiment, the present system and method may be used in a digital communication interface that is based on a low-power double data rate 4 (LP-DDR4) dynamic random-access memory (DRAM). For example, the digital communication interface of a LP-DDR4 DRAM runs at 32 gigabit per second (Gbps) per a pair of traces, and it is much higher than 3 Gbps to 4 Gbps per a lane of the LP-DDR4 DRAM. This can significantly cut down the complexity of a package the LP-DDR4 DRAM and a routing between a modem and a radio frequency integrated circuit (RFIC) chip. The present system and method can improve the power efficiency of a SerDes circuit in a transmitter or a receiver of a high-speed data communication system that runs in a low bit-rate mode by quickly turning on/off the transmitter and/or the receiver to reduce their power consumption.

FIG. 2 shows a block diagram of an example quadrature detection and correction circuit, according to one embodiment. A quadrature detection and correction circuit 200 can detect a quadrature error of input clock signals and correct the detected quadrature error. The quadrature detection and correction circuit 200 can have a fast settling time in detecting and correcting the quadrature error as will be discussed in further detail below.

The quadrature detection and correction circuit 200 receives four input clock signals CIN0, CIN90, CIN180, and CIN270 that are of 90 degree difference from one another and generates four output clock signals COUT0, COUT90, COUT180, and COUT270. Although the present example shows four quadrature input clock signals, it is noted that the number of input and output clock signals may be variously changed without deviating from the scope of the present disclosure.

The quadrature detection and correction circuit 200 includes a quadrature correction circuit 210, a quadrature detector 220, and a quadrature correction controller 230. The quadrature detector 220 detects a quadrature error in the output clock signals COUT0, COUT90, COUT180, and COUT270 and sends a quadrature error to the quadrature correction controller 230. The quadrature correction controller 230 adjusts the quadrature correction circuit 210 based on the quadrature error received from the quadrature detector 220 to minimize the quadrature error. The quadrature correction controller 230 may generate and send enable signals (e.g., EN0, EN1, EN2, and EN3) to the quadrature detector 220 to select a pair of clock signals among the output clock signals COUT0, COUT90, COUT180, and COUT270. According to one embodiment, the enable signals may be multiplexed together when they are sent from the quadrature correction controller 230 to the quadrature detector 220.

According to one embodiment, the present system and method focuses on correcting a relative phase of the four output clock signals COUT0, COUT90, COUT180, and COUT270 that are of 90 degree difference from one another. In this case, the quadrature correction circuit 210 corrects a phase (or a phase delay) of three output clock signals among the four output clock signals COUT0, COUT90, COUT180, and COUT270 with reference to one of the four output clock signals.

Figure 3:
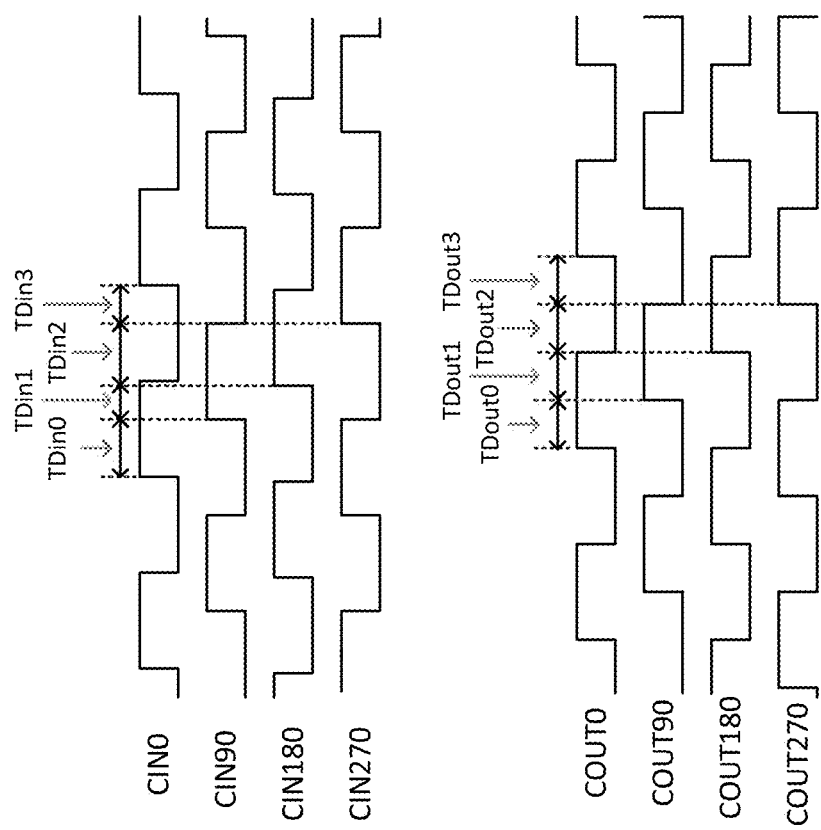
FIG. 3 shows a timing diagram of an example quadrature detection and correction circuit, according to one embodiment.

FIG. 3 shows a timing diagram of an example quadrature detection and correction circuit, according to one embodiment. TDin0, TDin1, TDin2 and TDin3 denote timing differences between rising edges of two input clock signal pairs (CIN0, CIN90), (CIN90, CIN180), (CIN180, CIN270) and (CIN270, CIN0). TDout0, TDout1, TDout2 and TDout3 denote timing differences between the rising edges of two output clock signal pairs (COUT0, COUT90), (COUT90, COUT180), (COUT180, COUT270) and (COUT270, COUT0) after applying an error correction using the quadrature detection and correction circuit. The four input clock signals CIN0, CIN90, CIN180, and CIN270 exhibit a quadrature error because the timing differences TDin0, TDin1, TDin2 and TDin3 between the rising edges of two input clock signal pairs are not the same. After applying quadrature correction, the quadrature detection and correction circuit 200 can minimize the differences among the four output clock signals TDout0, TDout1, TDout2 and TDout3.

Figure 4:
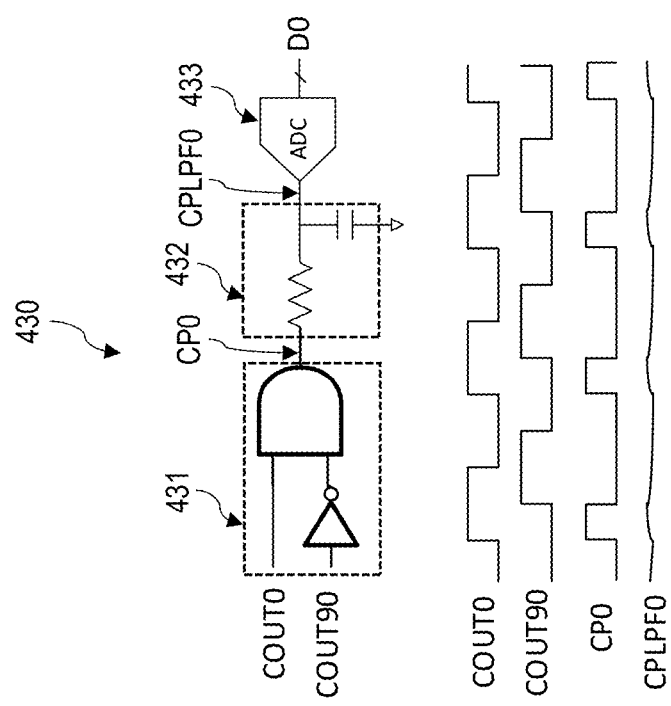
FIG. 4 shows a simplified circuit diagram of an example phase digitizer, according to one embodiment.

FIG. 4 shows a simplified circuit diagram of an example phase digitizer, according to one embodiment. A phase digitizer 430 includes a comparator 431, an resistor-capacitor (RC) filter 432, and an analog-to-digital converter (ADC) 433.

The comparator 431 receives two output clock signals COUT0 and COUT90 and generates a pulse train signal CP0 that goes high at the rising edges of the first output clock signal COUT0 and goes low at the falling edge of the second output clock signal COUT90. In other words, the pulse train signal CP0 includes a pulse with a duration that measures a relative time difference TDout0 between the rising edges of the two output clock signal pair COUT0 and COUT90. The RC filter 432 filters lower frequencies of the pulse train signal CP0 and generates a low-pass filtered pulse train signal CPLPF0. In this sense, the RC filter 432 is a low-pass filter. The RC filter 432 converts the resulting voltage value corresponding to the low-pass filtered pulse train signal CPLPF0 out of the RC filer 432 to a digital code D0. To suppress the voltage ripple (or high frequency components), a frequency bandwidth of the RC filter 432 may be set sufficiently low. This may result in a long settling time.

Similarly, the phase digitizer 430 can measure relative time differences TDout1, TDout2, and TDout3 between the output clock signal pairs (COUT90, COUT180), (COUT180, COUT270), and (COUT270, and COUT0) and generates corresponding digital codes D1, D2, and D3. Since the digital codes D1,D2,D3 represent the time differences between TDout1, TDout2, and TDout3, the quadrature clock signals can be calibrated using the algorithm shown in FIGS. 9 and 10. According to another embodiment, more than one phase digitizers 430 may be used to generate the digital codes D0, D1, D2, and D3. The digital codes D0, D1, D2, and D3 may be used to determine an amount of adjustment to the phases between the output clock signals COUT0, COUT90, COUT180, and COUT270.

Figure 5:
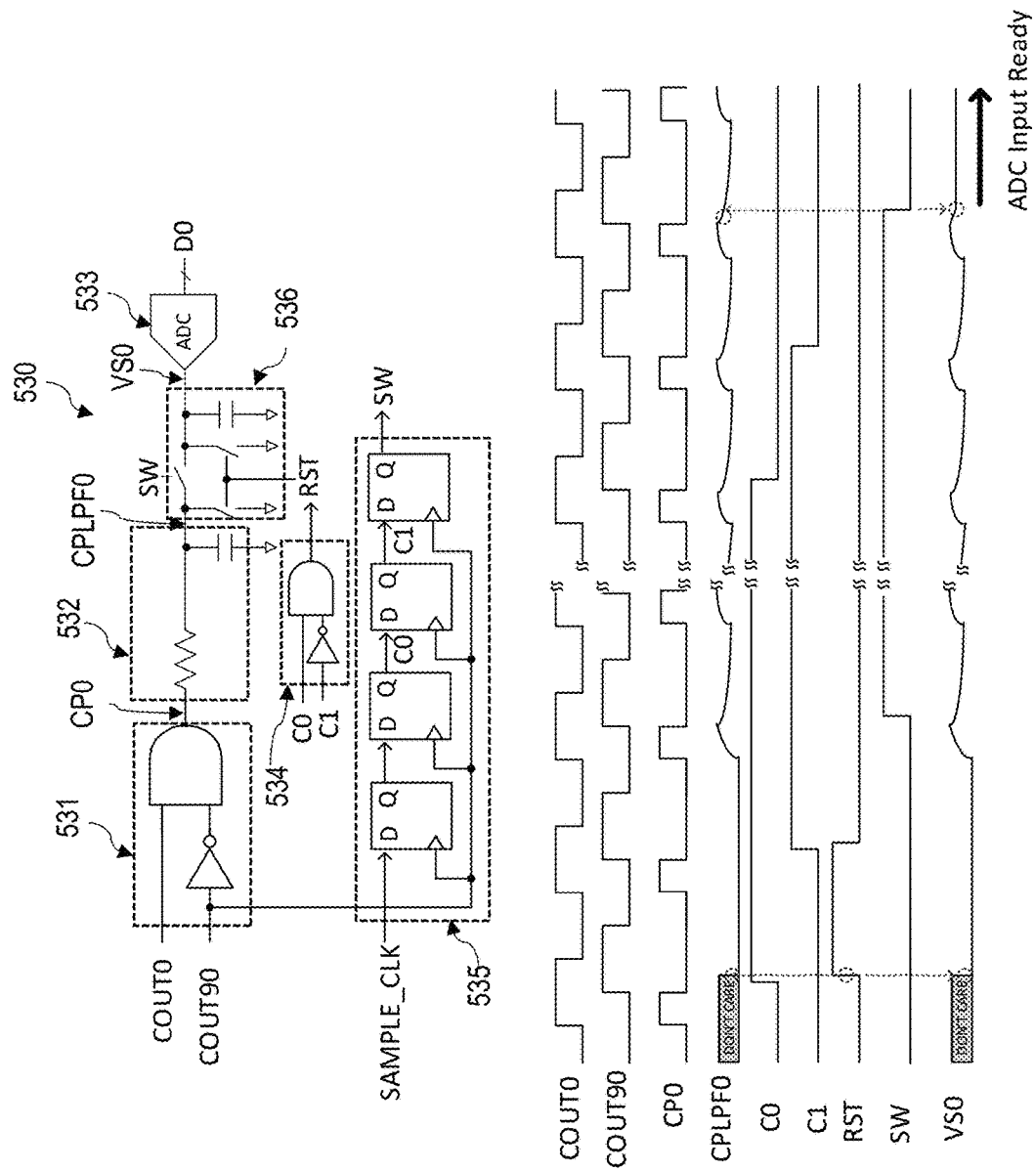
FIG. 5 shows a simplified circuit diagram of an example phase digitizer that has a fast settling time, according to one embodiment.

FIG. 5 shows a simplified circuit diagram of an example phase digitizer that has a fast settling time, according to one embodiment. A phase digitizer 530 includes a comparator 531, a low-pass RC filter 532, and an ADC 533. In addition, the phase digitizer 530 includes a reset signal generator 534, a synchronizer 535, and a sampler 536. The synchronizer

535 may also be referred to as a re-timer or a switch signal generator. The phase digitizer 530 can reduce a settling time of the phase digitizer 430 FIG. 4 using a sampling switch signal SW and a reset signal RST.

The synchronizer 535 includes a chain of four latches that are connected in series. An input clock signal SAMPLE_CLK (e.g., 500 MHz) that is input to the synchronizer 535 is synchronized to the second output clock signal COUT90. The second output clock signal COUT90 is used as a retiming clock. The input clock signal SAMPLE_CLK may be an external clock signal received from an external device. The output signals of the second latch and the third latch of the synchronizer 535 are respectively denoted as signals C0 and C1. The output signal of the last (fourth) latch of the synchronizer 535 is used as the sampling switch signal SW to turn on the switch to connect the output value CPLPF0 of the low-pass RC filter 532 to the sampler 536.

The reset signal generator 534 receives the signals C0 and C1 from the synchronizer 535 and generates a reset signal RST. The reset signal generator 534 may have the same logic gates as the comparator 531. In other words, the reset signal generator 534 generates the reset signal RST as a pulse train signal that goes high at the rising edges of the signal C0 and goes low at the falling edge of the signal C1.

The reset signal RST is used to reset the sampler 536, and the sampling switch signal SW is used to sample the output value CPLPF0 of the low-pass RC filter 532 at a time instant that is synchronized to the rising edge of the second output clock signal COUT90. The output signal VS0 of the sampler 536 is ready after the sampling switch signal SW goes low and input to the ADC 533.

The input clock signal SAMPLE_CLK may be asynchronous to the second output clock signal COUT90 that is used the retiming clock. Even if a pulse width in the input clock signal SAMPLE_CLK is fixed, the amount of time of the pulse in the sampling switch signal SW (i.e., a pulse width of the sampling switch signal SW) may vary depending on the timing of the input clock signal SAMPLE_CLK relative to the second output clock signal COUT90. If the pulse width of input clock signal SAMPLE_CLK is sufficiently long, a small difference in the of the pulse width of the sampling switch signal SW does not affect the result. However, if the pulse width of the input clock signal SAMPLE_CLK is short, the RC low-pass filter 532 may not have an enough time to settle, and resultantly, the input signal VS0 to the ADC 533 may depend on the pulse width of the sampling switch signal SW.

Figure 6:
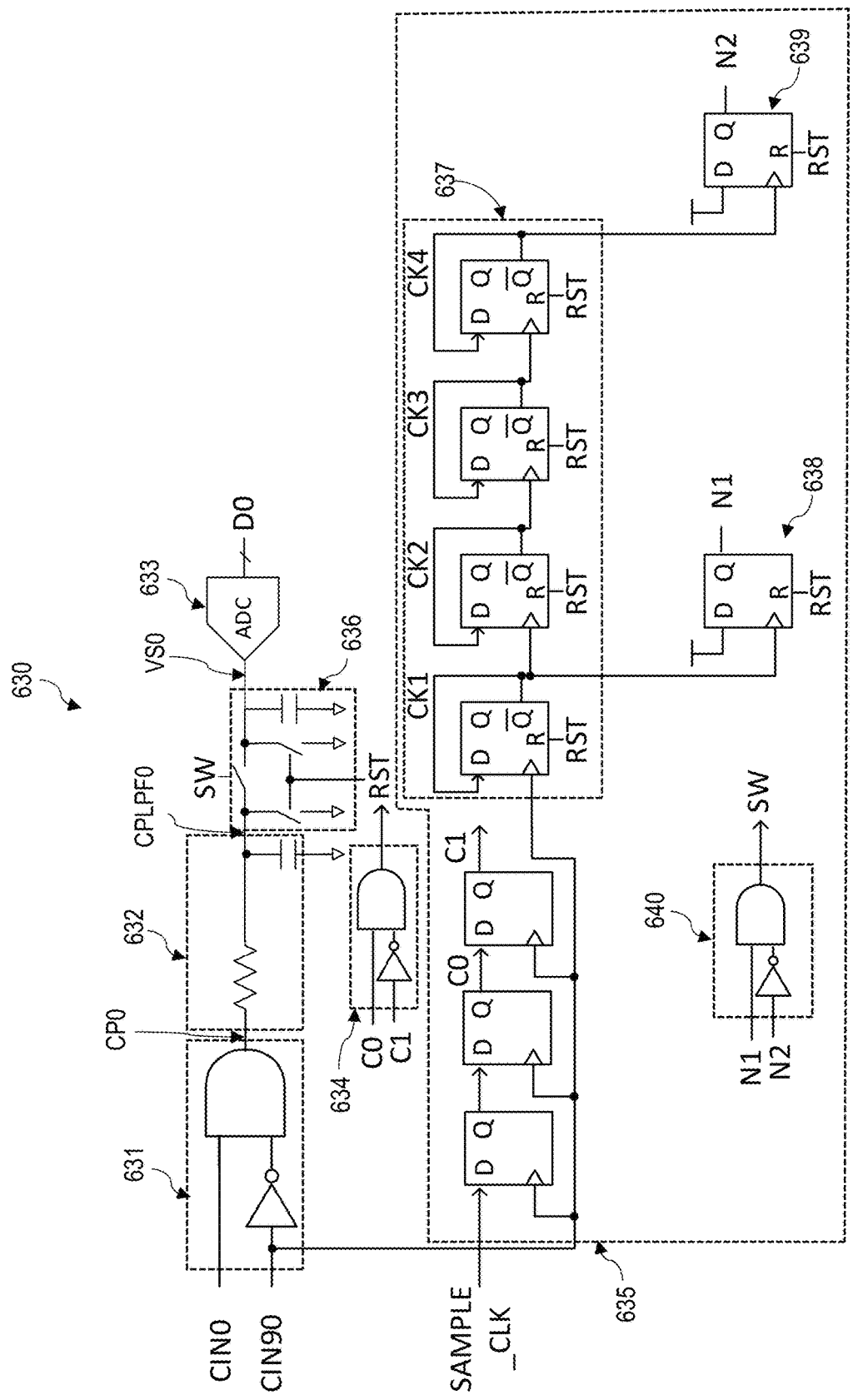
FIG. 6 shows a simplified circuit diagram of an example phase digitizer, according to another embodiment.

FIG. 6 shows a simplified circuit diagram of an example phase digitizer, according to another embodiment. A phase digitizer 630 includes a comparator 631, a low-pass RC filter 632, an ADC 633, a reset signal generator 634, a synchronizer 635, and a sampler 636. The phase digitizer 630 is similar to the phase digitizer 530 of FIG. 5 except for the synchronizer 635. The synchronizer 635 includes three latches instead of four latches, and a division-by-two circuit 637, two additional latches 638 and 639, and a switch signal generator 640.

The division-by-two circuit 637 includes a chain of four divide-by-two circuits that control a pulse width of the sampling switch signal SW. Although the present example shows that the division-by-two circuit 637 includes four divide-by-two circuits, it is noted that the number of divide-by-two stages may vary to adjust the pulse width of the sampling switch signal SW depending on a settling requirement.

The output signal CK1 of the first divide-by-two circuit of the division-by-two circuit 637 is fed to the second divide-by-two circuit and the latch 638. The output signal CK4 of the fourth divide-by-two circuit of the division-by-two circuit 637 is fed to the latch 639. The output signal N1 of the latch 638 and the output signal N2 of the latch 639 are fed to the switch signal generator 640 to generate the sampling switch signal SW.

The switch signal generator 640 generates a fixed duration of the sampling switch signal SW that is independent of the pulse width of the input clock signal SAMPLE_CLK. Therefore, the low-pass RC filter 632 of the phase digitizer 630 can have a fast settling time compared to the low-pass RC filter 532 of the phase digitizer 530 shown in FIG. 5 even in a case where the input clock signal SAMPLE_CLK is short as discussed above.

Figure 7:
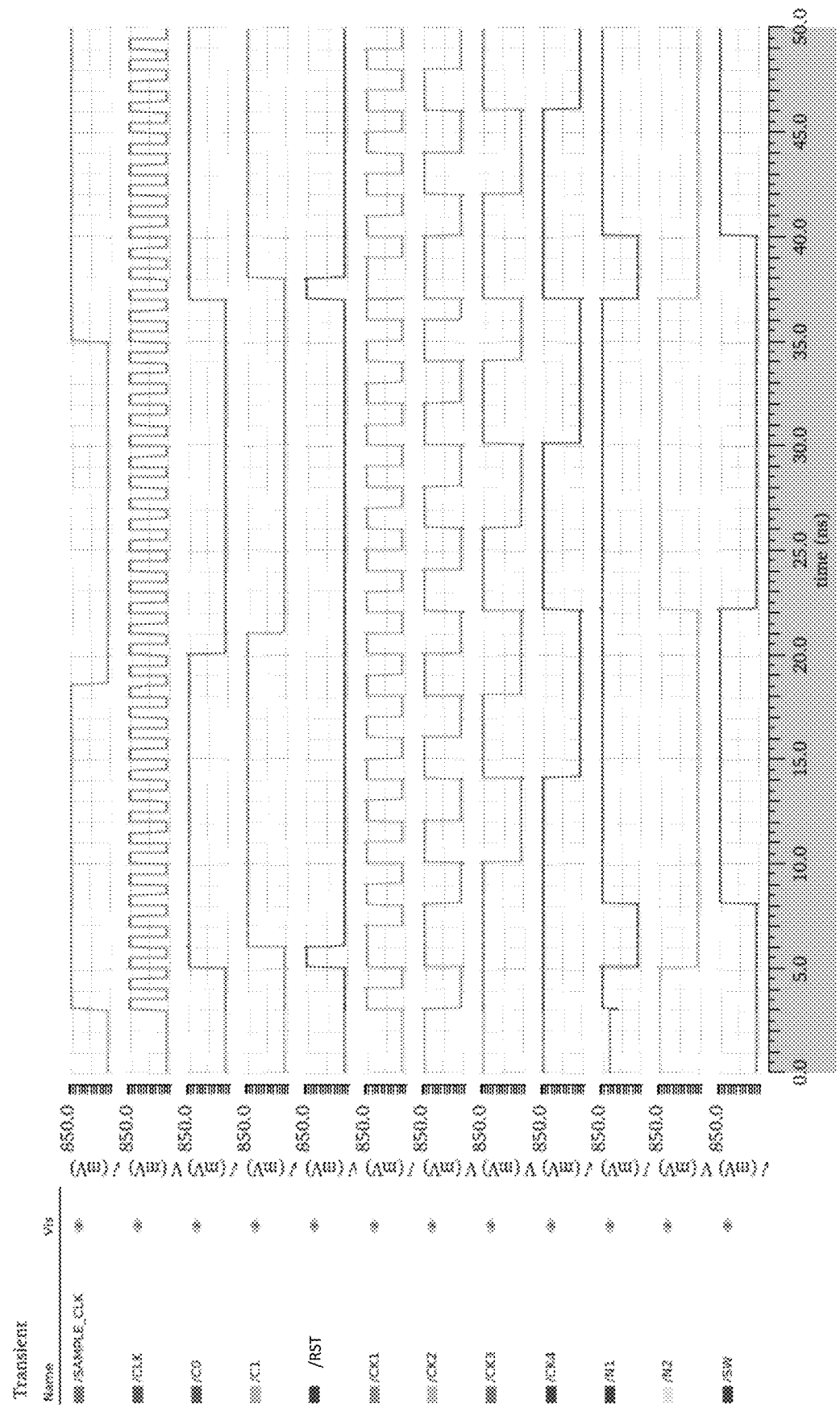
FIG. 7 shows an example timing diagram of the phase digitizer shown in FIG. 6, according to one embodiment.

FIG. 7 shows an example timing diagram of the phase digitizer shown in FIG. 6, according to one embodiment. It is noted that the sampling switch signal SW has a fixed pulse width.

Figure 8:
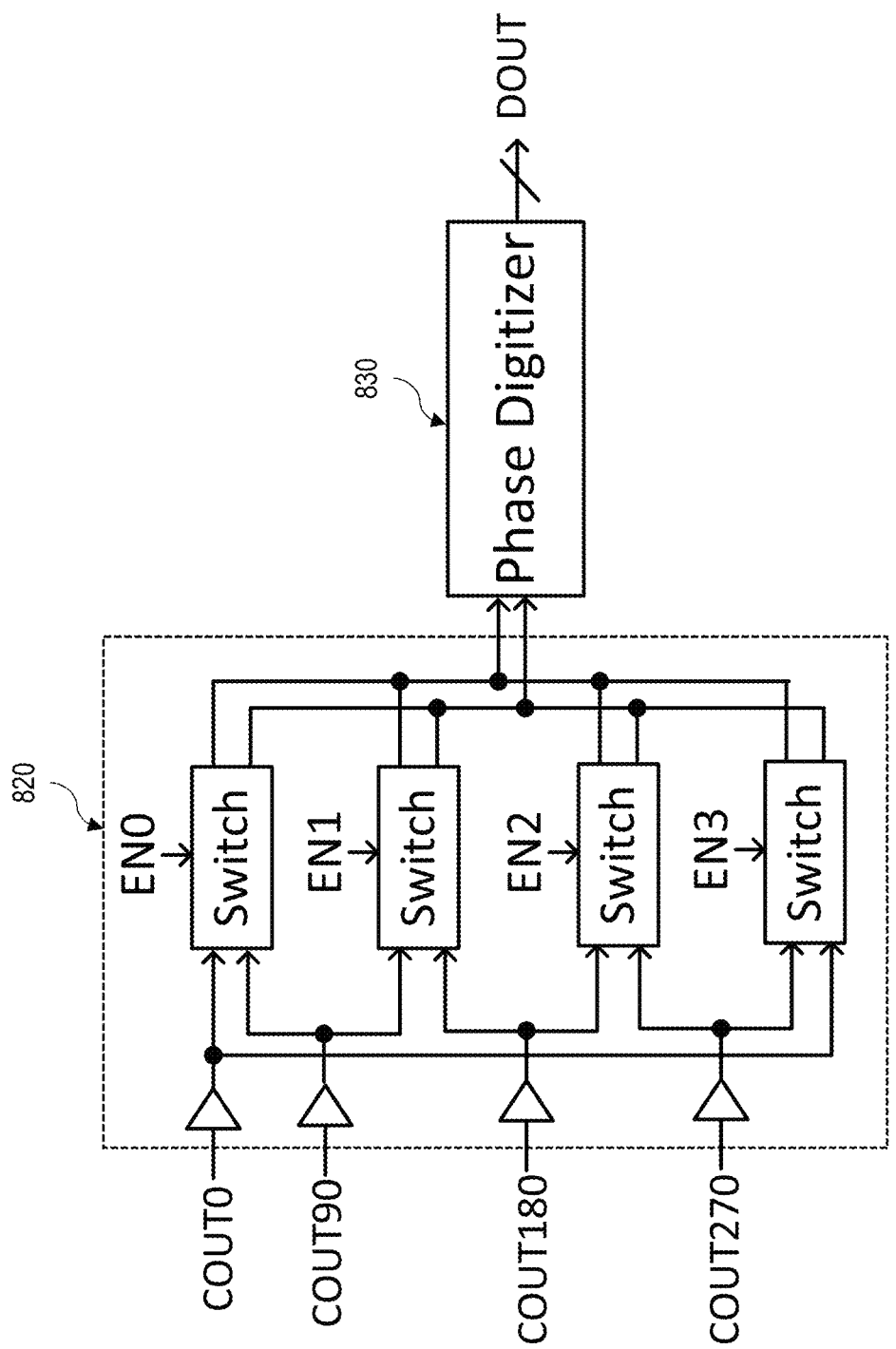
FIG. 8 shows a simplified circuit diagram of an example quadrature detector, according to one embodiment.

FIG. 8 shows a simplified circuit diagram of an example quadrature detector, according to one embodiment. A quadrature detector 820 generates switched signals that are fed to a phase digitizer 820. The clock signals COUT0, COUT90, COUT180, and COUT270 that are input to the quadrature detector 820 are buffered to drive four pairs of switches. At any given time, only two clock signals are selected to drive the phase digitizer 830 depending on enable signals EN0, EN1, EN2, and EN3. For example, when the enable signal EN0 is received, the quadrature detector 820 selects the clock signals COUT0 and COUT90; when the enable signal EN1 is received, the quadrature detector 820 selects the clock signals COUT90 and COUT180; when the enable signal EN2 is received, the quadrature detector 820 selects the clock signals COUT180 and COUT270; and when the enable signal EN4 is received, the quadrature detector 820 selects the clock signals COUT270 and COUT0. Because the mismatches of an input clock buffer circuit and the sampling switch signal add an extra time difference at the phase digitizer input, the phase digitizer cannot detect the time differences TDout1, TDout2, and TDout3 accurately. To achieve accurate detection results, the mismatches of the input clock buffer circuit and the sampling switch signal must be smaller than the desired detection precision.

Figure 9:
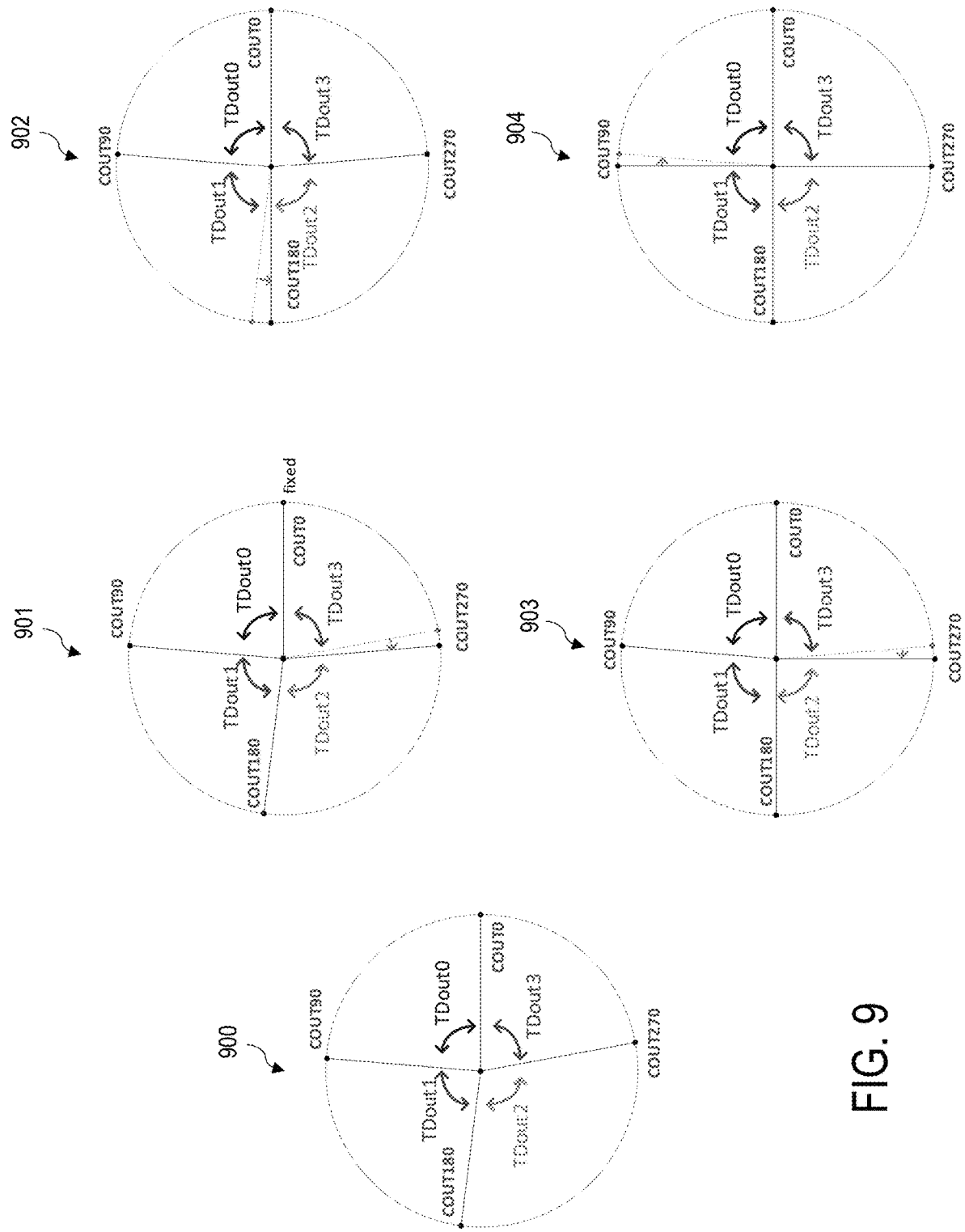
FIG. 9 illustrates an example procedure for correcting a quadrature error, according to one embodiment.

FIG. 9 illustrates an example procedure for correcting a quadrature error, according to one embodiment. The quadrature correction procedure may be divided in a plurality of steps to correct the phases of the output clock signals COUT90, COUT180 and COUT270 relative to the phase of the output clock signal COUT0. In the present example, the output clock signal COUT0 is used as a reference clock signal with reference to which the other three output clock signals COUT90, COUT180 and COUT270 are corrected. Before the quadrature error correction as shown in 900, the relative time differences TDout0, TDout1, TDout2, and TDout3 of the output clock signal pairs (COUT0, COUT90), (COUT90, COUT180), (COUT180, COUT270) and (COUT270, COUT0) are not the same, thereby exhibiting a quadrature error. The goal of the quadrature error correction is to make the phases of the clock signals COUT0, COUT90, COUT180 and COUT270 to be 90 degrees such that the relative time differences TDout0, TDout1, TDout2, and TDout3 of the output clock signal pairs (COUT0, COUT90), (COUT90, COUT180), (COUT180, COUT270) and (COUT270, COUT0) are the same.

At step 901, the quadrature correction circuit adjusts the clock signal COUT270 until the clock signal COUT0 is placed in the middle of the clock signals COUT90 and COUT270, i.e., the time differences TDout0 and TDout3 become equal. At step 902, the quadrature correction circuit adjusts the clock signal COUT180 until the clock signal COUT180 is placed in the middle of the clock signals COUT90 and COUT270, i.e., the time differences TDout1 and TDout2 become equal. At step 903, the quadrature correction circuit adjusts the clock signal COUT270 until the clock signal COUT270 is placed in the middle of the clock signals COUT0 and COUT180, i.e., the time differences TDout2 and TDout3 become equal. At step 904, the quadrature correction circuit adjusts the clock signal COUT90 until the clock signal COUT90 is placed in the middle of the clock signals COUT0 and COUT180, i.e., the time differences TDout0 and TDout1 become equal.

Figure 10:
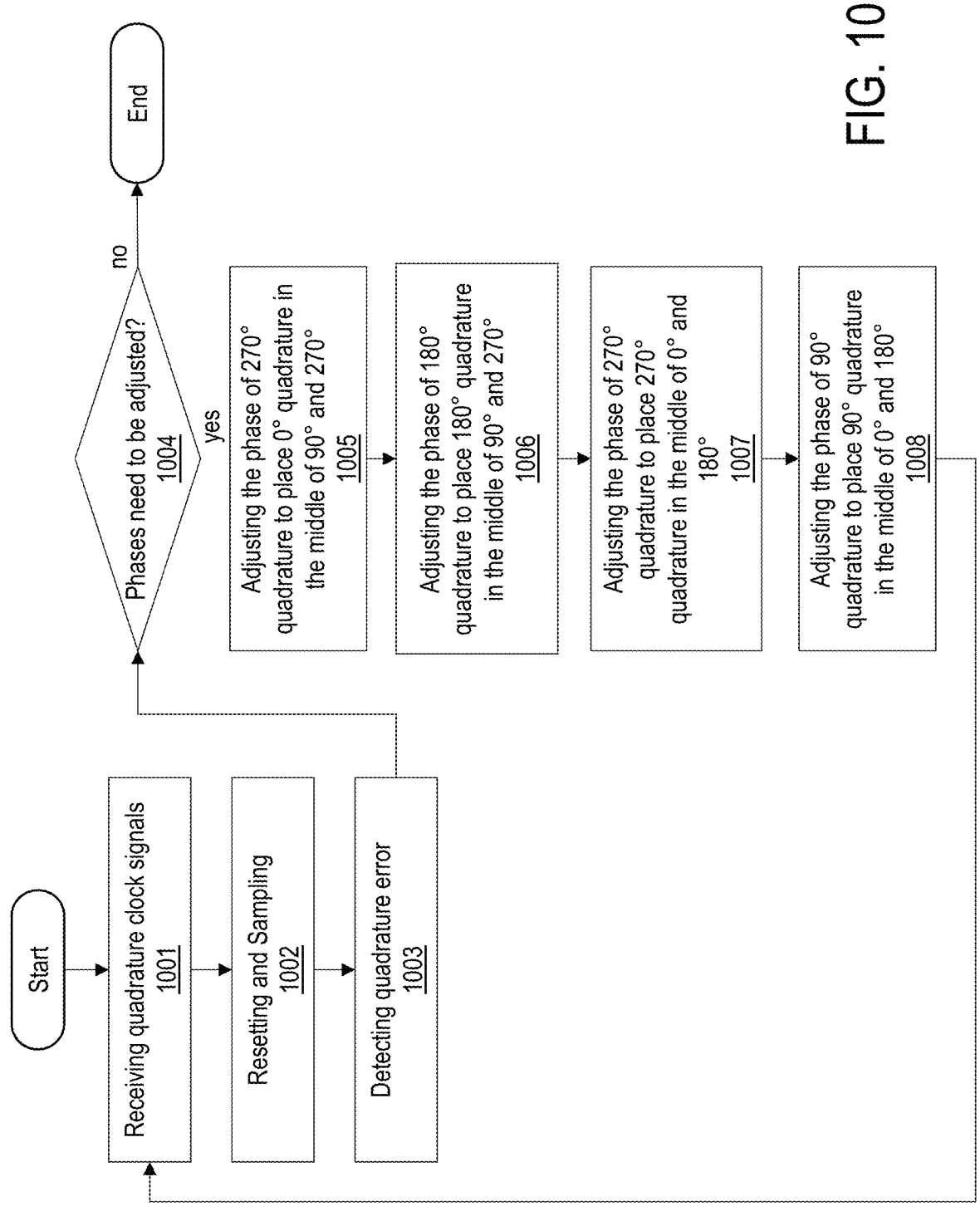
FIG. 10 is a flow chart of an example quadrature correction scheme, according to one embodiment.

FIG. 10 is a flow chart of an example quadrature correction scheme, according to one embodiment. A quadrature detection and correction circuit receives quadrature clock signals (at 1001) and resets and samples the received quadrature clock signals (at 1002). If the quadrature detection and correction circuit detects that the sampled quadrature clock signals have mismatched time differences between adjacent quadrature clock signals indicating a quadrature error (at 1003) and determines whether phase adjustments need to be made to the quadrature clock signals (at 1004). If the amount of mismatch between adjacent quadrature clock signals is smaller than a threshold value, the quadrature detection and correction circuit bypasses a quadrature correction procedure.

If the quadrature detection and correction circuit determines that the quadrature error is too large, and it needs to be corrected, the quadrature detection and correction circuit performs a multiple step quadrature correction procedure, for example, the four-step quadrature correction procedure as discussed above. The quadrature detection and correction circuit adjusts the phase of the 270° quadrature to place the 0° quadrature in the middle of 90° and 270° (at 1005). Next, the quadrature detection and correction circuit adjusts the phase of the 180° quadrature to place the 180° quadrature in the middle of 90° and 270° (at 1006). Next, the quadrature detection and correction circuit adjusts the phase of the 270° quadrature to place the 270° quadrature in the middle of 0° and 180° (at 1007). Lastly, the quadrature detection and correction circuit adjusts the phase of the 90° quadrature to place the 90° quadrature in the middle of 0° and 180° (at 1008). The processes 1001-1008 repeat until the quadrature error becomes smaller than the threshold value. The adjusted quadrature clock signals can provide accurate clock signals that can be used to recover data transmitted and received between high-speed data communication devices. With accurate clock signals, the data can be transmitted and received at the correct time slots, otherwise it can cause a bit error.

According to one embodiment, an apparatus includes: a quadrature correction circuit that receives four quadrature clock signals; a quadrature detector that selects two clock signals among the four quadrature clock signals; and a phase digitizer that generates a digital code indicating a phase difference between the two clock signals. The quadrature correction circuit adjusts a phase between the two clock signals using the digital code.

The phase digitizer may include a comparator that receives the two clock signals from the quadrature detector that are selected based on an enable signal and generate a pulse signal. The pulse signal may go high at a first rising edge of a first clock signal of the two clock signals and go low at a falling edge of a second clock signal of the two clock signals.

The phase digitizer may further include a low-pass filter that generates a filtered pulse signal, and the quadrature correction circuit may adjust the phase between the two clock signals using the filtered pulse signal.

The phase digitizer may further include an analog-to-digital converter (ADC) that convers the filtered pulse signal to the digital code.

The quadrature correction circuit may adjust one or more phases between adjacent ones of the four quadrature clock signals phases in a sequence.

The phase digitizer may further include a synchronizer and a sampler, and the synchronizer may generate a sampling switch signal that is synchronized with one of the two clock signals and provide the sampling switch signal to the sampler.

The phase digitizer may further include a reset signal generator that generates a reset signal and provides the reset signal to the sampler, and the sampler may provide the filtered pulse signal to the ADC based on the reset signal and the sampling switch signal.

The synchronizer may further include a chain of divide-by-two latches and a switch signal generator that generates the sampling switch signal.

The sampling switch signal may have a fixed pulse width.

The filtered pulse signal out of the sampler may be ready after the sampling switch signal goes low and input to the ADC.

According to another embodiment, a method includes: receiving four quadrature clock signals including a first quadrature clock signal, a second quadrature clock signal, a third quadrature clock signal, and a fourth quadrature clock signal; selecting two clock signals among the four quadrature clock signals; generating a digital code that indicates a phase difference between the two clock signals; detecting an amount of a quadrature error based on the digital code; and adjusting a phase between the two clock signals based on the digital code.

The method may further include generating a pulse signal that goes high at a first rising edge of a first clock signal of the two clock signals and goes low at a falling edge of a second clock signal of the two clock signals.

The method may further include filtering the pulse signal to generate a filtered pulse signal using a low-pass filter.

The method may further include: generating a sampling switch signal that is synchronized with one of the two clock signals; and providing the sampling switch signal to an analog-to-digital converter (ADC) that convers the filtered pulse signal to the digital code.

The method may further include: generating a reset signal that is synchronized with one of the two clock signals; and providing the filtered pulse signal to the ADC based on the reset signal and the sampling switch signal.

The sampling switch signal may have a fixed pulse width.

The method may further include: adjusting a phase of the fourth quadrature clock signal to place the first quadrature clock signal in a middle of the second quadrature clock signal and the fourth quadrature clock signal; adjusting a phase of the third quadrature clock signal to place the third quadrature clock signal in a middle of the second quadrature clock signal and the fourth quadrature clock signal; adjusting the phase of the fourth quadrature clock signal to place the fourth quadrature clock signal in a middle of the first quadrature clock signal and the third quadrature clock signal; and adjusting a phase of the second quadrature clock signal to place the second quadrature clock signal in the middle of the first quadrature clock signal and the third quadrature clock signal.

The method may further include repeating steps of adjusting until the phase differences between adjacent ones of the four quadrature clock signals are within a predetermined threshold value.

The above example embodiments have been described hereinabove to illustrate various embodiments of implementing a system and method for providing a system and method for providing a fast-settling quadrature detection and correction in any circuit and system that need accurate quadrature clock signals, such as a serializer/deserializer (SerDes) circuit and a wireless transceiver with quadrature modulation. Various modifications and departures from the disclosed example embodiments will occur to those having ordinary skill in the art. The subject matter that is intended to be within the scope of the invention is set forth in the following claims.

What is claimed is:

1. An apparatus comprising:
   a detector configured to select a first quadrature clock signal and a second quadrature clock signal that is adjacent to the first quadrature clock signal among four quadrature clock signals based on a first enable signal and detect a first clock error of the first quadrature clock signal; and
   a correction circuit configured to adjust a first phase of the first quadrature clock signal with respect to the second quadrature clock signal to correct the first clock error of the first quadrature clock signal,
   wherein the correction circuit is further configured to place the first phase of the first quadrature clock signal in a middle between the second quadrature clock signal and a third quadrature clock signal that is adjacent to the first quadrature clock signal.

2. The apparatus of claim 1, wherein the detector is further configured to select the second quadrature clock signal and a third quadrature clock signal that is adjacent to the second quadrature clock signal among the four quadrature clock signals based on a second enable signal and detect a second clock error of the second quadrature clock signal, and
   wherein the correction circuit is further configured to adjust a second phase of the second quadrature clock signal with respect to the first quadrature clock signal or the third quadrature clock signal to correct the second clock error of the second quadrature clock signal.

3. The apparatus of claim 1, further comprising a controller configured to generate a plurality of multiplexed enable signals including the first enable signal and the second enable signal and send the plurality of multiplexed enable signals to the detector.

4. The apparatus of claim 3, wherein the correction circuit is further configured to adjust one or more phases between adjacent ones of the four quadrature clock signals in a sequence based on the plurality of multiplexed enable signals.

5. The apparatus of claim 1, further comprising a phase digitizer configured to generate a digital code indicating a phase difference between the first quadrature clock signal and the second quadrature clock signal.

6. The apparatus of claim 5, wherein the correction circuit is further configured to adjust the first phase of the first quadrature clock signal using the digital code.

7. The apparatus of claim 5, wherein the phase digitizer comprises a comparator configured to generate a pulse signal, wherein the pulse signal goes high at a first rising edge of the first quadrature clock signal and goes low at a falling edge of the second quadrature clock signal.

8. The apparatus of claim 7, wherein the phase digitizer further comprises an analog-to-digital converter (ADC) configured to convert the pulse signal to the digital code.

9. The apparatus of claim 8, wherein the phase digitizer further comprises a low-pass filter configured to generate a filtered pulse signal from the pulse signal, and wherein the ADC is configured to convert the filtered pulse signal to the digital code.

10. A method comprising:
    receiving four quadrature clock signals including a first quadrature clock signal, a second quadrature clock signal, a third quadrature clock signal, and a fourth quadrature clock signal;
    receiving a first enable signal;
    selecting the first quadrature clock signal and the second quadrature clock signal that is adjacent to the first quadrature clock signal among the four quadrature clock signals based on the first enable signal;
    detecting a first clock error of the first quadrature clock signal; and
    adjusting a first phase of the first quadrature clock signal with respect to the second quadrature clock signal to correct the first clock error of the first quadrature clock signal by placing the first phase of the first quadrature clock signal in a middle between the second quadrature clock signal and the third quadrature clock signal that is adjacent to the first quadrature clock signal.

11. The method of claim 10 further comprising:
    receiving a second enable signal;
    selecting the second quadrature clock signal and the third quadrature clock signal that is adjacent to the second quadrature clock signal among the four quadrature clock signals based on the second enable signal;
    detecting a second clock error of the second quadrature clock signal, and
    adjusting a second phase of the second quadrature clock signal with respect to the first quadrature clock signal or the third quadrature clock signal to correct the second clock error of the second quadrature clock signal.

12. The method of claim 10, further comprising:
    generating a plurality of multiplexed enable signals including the first enable signal and the second enable signal.

13. The method of claim 12, further comprising:
    adjusting one or more phases between adjacent ones of the four quadrature clock signals in a sequence based on the plurality of multiplexed enable signals.

14. The method of claim 10, further comprising:
    generating a digital code indicating a phase difference between the first quadrature clock signal and the second quadrature clock signal.

15. The method of claim 14, further comprising:
    adjusting the first phase of the first quadrature clock signal using the digital code.

16. The method of claim 14, further comprising:
    generating a pulse signal that goes high at a first rising edge of the first quadrature clock signal and goes low at a falling edge of the second quadrature clock signal.

17. The method of claim 16, further comprising:
    converting the pulse signal to the digital code.

18. The method of claim 16, further comprising:
    generating a filtered pulse signal from the pulse signal; and
    converting the filtered pulse signal to the digital code.

* * * * *